US009301421B2

(12) United States Patent
French, Jr. et al.

(10) Patent No.: US 9,301,421 B2
(45) Date of Patent: Mar. 29, 2016

(54) CLOSED LOOP LIQUID COOLING SYSTEM FOR ELECTRONIC PACKAGES

(71) Applicant: International Business Machines Corporation, Armonk, NY (US)

(72) Inventors: Michael D. French, Jr., Raleigh, NC (US); James J. Parsonese, Cary, NC (US); Kevin S. D. Vernon, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 195 days.

(21) Appl. No.: 14/086,650

(22) Filed: Nov. 21, 2013

(65) Prior Publication Data

US 2015/0138722 A1    May 21, 2015

(51) Int. Cl.
| | | |
|---|---|---|
| *H02B 1/00* | (2006.01) | |
| *G06F 1/20* | (2006.01) | |
| *H05K 5/00* | (2006.01) | |
| *H05K 7/20* | (2006.01) | |

(Continued)

(52) U.S. Cl.
CPC .. *H05K 7/20* (2013.01); *F28D 7/00* (2013.01); *G06F 1/20* (2013.01); *H05K 7/20254* (2013.01); *H05K 7/20727* (2013.01); *H05K 7/20772* (2013.01)

(58) Field of Classification Search
CPC ........ H05K 7/20; H05K 7/20254; F28D 7/10; F28F 7/00; G06F 1/20; F04B 35/01
USPC ...................... 361/676–678, 679.46–679.54, 361/688–723, 831; 174/252, 526, 15.1, 174/16.1; 165/80.2, 80.4, 104.31, 104.33; 257/714
See application file for complete search history.

(56) References Cited

U.S. PATENT DOCUMENTS 6,832,646 B1    12/2004    Uomori et al.
6,868,809 B1    3/2005    Robb
(Continued)

FOREIGN PATENT DOCUMENTS

EP    0 376 352 A2    7/1990
EP    1 605 146 A1    12/2005
(Continued)

OTHER PUBLICATIONS

Wikipedia, "Bevel gear", wikipedia.org (online publication), accessed Jun. 19, 2013, pp. 1-6, URL: http://en.wikipedia.org/wiki/Bevel_gear.

(Continued)

*Primary Examiner* — Courtney Smith
*Assistant Examiner* — Zhengfu Feng
(74) *Attorney, Agent, or Firm* — Edward J. Lenart; Katherine S. Brown; Kennedy Lenart Spraggins LLP

(57) ABSTRACT

A closed loop liquid cooling system for electronic packages, the closed loop liquid cooling system including: a fan impeller configured so that air flows from the fan impeller through a radiator of the closed loop liquid cooling system; an electric motor coupled to the fan impeller, the electric motor configured to rotate the fan impeller; and a pump impeller configured for delivering liquid to the electronic package via a cold plate, the pump impeller mechanically coupled to the fan impeller such that rotating the fan impeller causes the pump impeller to rotate such that liquid is circulated in the closed loop liquid cooling system.

20 Claims, 5 Drawing Sheets

(51) Int. Cl.
*H05K 1/00* (2006.01)
*F28F 7/00* (2006.01)
*F28D 7/00* (2006.01)

(56) References Cited

U.S. PATENT DOCUMENTS

| | | |
|---|---|---|
| 7,424,907 B2 | 9/2008 | Chou et al. |
| 2008/0164011 A1* | 7/2008 | Chen ................ 165/104.33 |
| 2012/0076676 A1 | 3/2012 | Lee |

FOREIGN PATENT DOCUMENTS

| | | | |
|---|---|---|---|
| JP | 2001/320187 A | | 11/2001 |
| JP | 2011/222692 A | | 11/2011 |
| JP | 2011222692 A | * | 11/2011 |

OTHER PUBLICATIONS

DHGate.com, "130 Geared Motor 6V Powerful Dual-axis Drive Carbon Brush Magnetic DIY Gear Gearbox Motor Toy Motors", product detail, RC Engines, Parts, & Accessories, DHGate.com (online), accessed Jun. 19, 2013, pp. 1-2, URL: http://www.dhgate.com/130-geared-motor-6v-powerful-dual-axis-drive/p-ff8080813976b0f90139af9978745cd9.html.

* cited by examiner

CLOSED LOOP LIQUID COOLING SYSTEM FOR ELECTRONIC PACKAGES

BACKGROUND OF THE INVENTION

1. Field of the Invention

The field of the invention is apparatus and products for liquid cooling systems for electronic packages.

2. Description of Related Art

Modern computing systems can include many heat-producing computing components. In order to guard against damage to such computing components in a computing system, and in an attempt to maintain acceptable system operation, cooling components can be added to a computing system. Such cooling components can frequently consume valuable space and consume large amounts of energy in order to carry out cooling operations.

SUMMARY OF THE INVENTION

A closed loop liquid cooling system for electronic packages, the closed loop liquid cooling system including: a fan impeller configured so that air flows from the fan impeller through the radiator of the closed loop liquid cooling system; an electric motor coupled to the fan impeller, the electric motor configured to rotate the fan impeller; and a pump impeller configured for delivering liquid to the electronic package via a cold plate, the pump impeller mechanically coupled to the fan impeller such that rotating the fan impeller causes the pump impeller to rotate such that liquid is circulated in the closed loop liquid cooling system.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
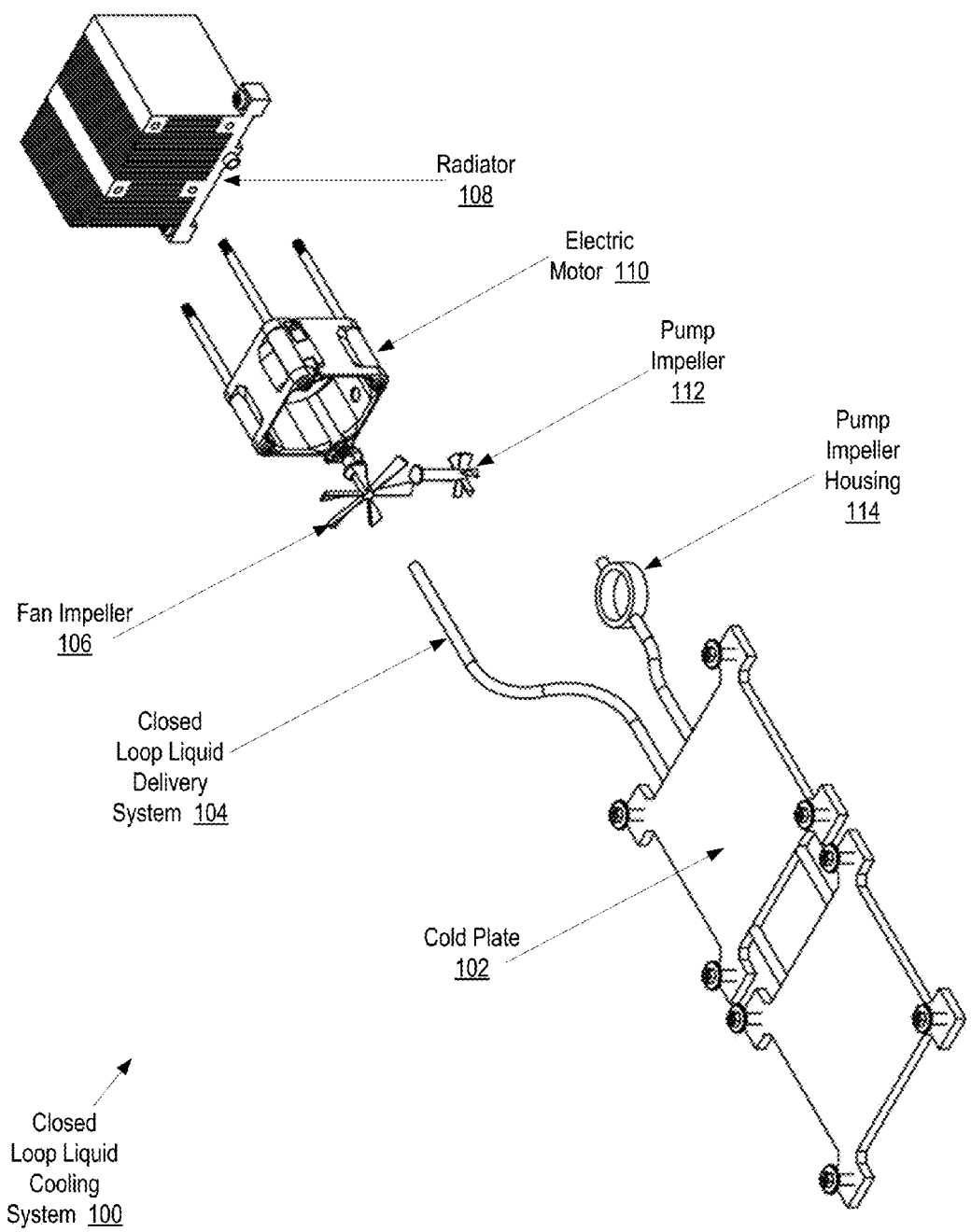
FIG. 1 sets forth a diagram of a closed loop liquid cooling system for electronic packages according to embodiments of the present invention.

Example apparatuses and systems that include a closed loop liquid cooling system are described with reference to the accompanying drawings, beginning with FIG. 1. FIG. 1 sets forth a diagram of a closed loop liquid cooling system (100) for electronic packages according to embodiments of the present invention. In the example of FIG. 1, the closed loop liquid cooling system (100) represents physical mechanisms for cooling electronic packages such as a computer processor.

Although not depicted in FIG. 1, a computer processor may sit underneath the cold plate (102) depicted in FIG. 1 such that the closed loop liquid cooling system (100) removes heat from the computer processor. In the example depicted in FIG. 1, the component parts of the closed loop liquid cooling system (100) are depicted as being unconnected so that each component part can be better viewed and explained.

The closed loop liquid cooling system (100) depicted in FIG. 1 includes a fan impeller (106) configured so that air flows from the fan impeller through the radiator of the closed loop liquid cooling system. In the example method of FIG. 1, fan impeller (106) is configured so that air flows from the fan impeller through the radiator of the closed loop liquid cooling system when the fan impeller (106) is rotated, such that cooler air is drawn into a chassis that includes the closed loop liquid cooling system (100) and warm air heated by the operation of the electronic package is expelled from a chassis that includes the closed loop liquid cooling system (100). In such a way, the fan impeller (106) may be part of an active cooling component for removing heat generated by the operation of the electronic package and other heat-producing computing devices.

The closed loop liquid cooling system (100) depicted in FIG. 1 also includes an electric motor (110) coupled to the fan impeller (106). The electric motor (110) of FIG. 1 may be embodied, for example, as an electric machine that converts electrical energy into mechanical energy. Such an electric motor (110) may receive electrical energy from a power source such as a battery, a power distribution unit ('PDU'), and so on. The electric motor (110) of FIG. 1 may be coupled to the fan impeller (106), for example, by an impeller shaft as will be described below in greater detail. In such an example, the electric motor (110) may impart mechanical energy onto the impeller shaft, thereby causing the fan impeller (106) to rotate.

The closed loop liquid cooling system (100) depicted in FIG. 1 also includes a pump impeller (112). The pump impeller (112) of FIG. 1 may be embodied, for example, as a rotor used to alter the pressure and flow of a liquid. For example, the pump impeller (112) may be positioned relative to the closed loop liquid delivery system (104) such that rotating the pump impeller (112) causes liquid to flow through the closed loop liquid delivery system (104). In such an example liquid flows through the closed loop liquid delivery system (104) by the rotation of the pump impeller (112) causing fins of the pump impeller (112) to push the liquid through the pipes that comprise the closed loop liquid delivery system (104). In such a way, liquid flows through the cold plate and removes heat from the electronic package. As such, the pump impeller (112) of FIG. 1 is configured for delivering liquid to the electronic package via a cold plate (102).

The pump impeller (112) of FIG. 1 is mechanically coupled to the fan impeller (106) such that rotating the fan impeller (106) causes the pump impeller (112) to rotate such that liquid is circulated in the closed loop liquid cooling system (100). The pump impeller (112) of FIG. 1 may be mechanically coupled to the fan impeller (106) of FIG. 1, for example, through the use of a bevel gear as will be described in greater detail below. In such an example, teeth of the bevel gear that are located on a shaft for the fan impeller (106) may be mechanically coupled to teeth of the bevel gear that are located on a shaft for the pump impeller (112), such that rotating the fan impeller (106) causes the pump impeller (112) to rotate. In such an example, the rotation of the pump impeller (112) may cause liquid to flow through the closed loop liquid delivery system (104).

In the example of FIG. 1, the closed loop liquid delivery system (104) may be embodied as a pipe through which liquid can flow. The closed loop liquid delivery system (104) may be coupled through a cold plate (102) that transfers heat generated by computing components such as the electronic package. Such a cold plate (102) may transfer heat away from heat-generating computing components through physical contact with the heat-generating computing components or their mountings. In such an example, liquid can flow through the closed loop liquid delivery system (104) into the cold plate (102), at which point heat generated by the heat-generating computing component will be transferred to the liquid flowing through the cold plate (102). The heated liquid may subsequently exit the cold plate (102) via the closed loop liquid delivery system (104) for delivery to a radiator (108).

The radiator (108) of FIG. 1 may be embodied, for example, as heat exchanger used to transfer thermal energy from one medium to another for the purpose of cooling liquid that flows through the closed loop liquid delivery system (104). In the example of FIG. 1, liquid may be heated as it flows through the cold plate (102) and exits the cold plate (102) via the closed loop liquid delivery system (104). Upon delivery of the heated liquid from the closed loop liquid delivery system (104) to the radiator (108), the radiator may remove heat from the liquid through thermal convection, transferring the thermal energy from the liquid to the ribs of the radiator (108). In such an example, the airflow generated by the rotation of the fan impeller (106) may cause air to flow through the radiator (108), transferring thermal energy from the radiator (108) away from the electronic package, such that thermal energy is removed from a chassis that includes the closed loop liquid cooling system (100) as exhaust from the chassis.

Figure 2:
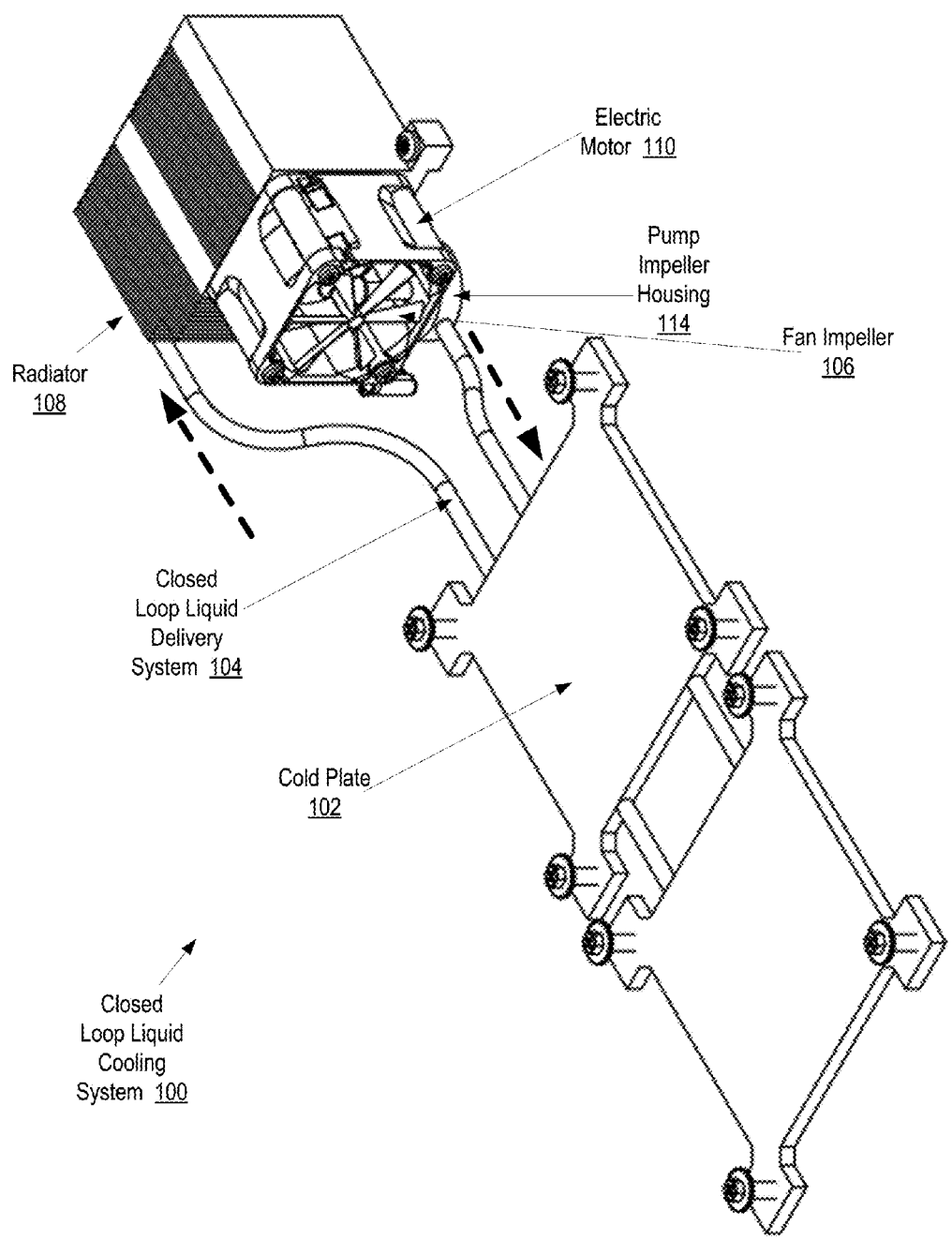
FIG. 2 sets forth an additional diagram of a closed loop liquid cooling system for electronic packages according to embodiments of the present invention.

For further explanation, FIG. 2 sets forth an additional diagram of a closed loop liquid cooling system (100) for electronic packages according to embodiments of the present invention. The example closed loop liquid cooling system (100) of FIG. 2 is similar to the example closed loop liquid cooling system (100) of FIG. 1, as it also includes a fan impeller (106) configured so that air flows from the fan impeller through the radiator of the closed loop liquid cooling system, an electric motor (110) coupled to the fan impeller (106), and a pump impeller (112 of FIG. 1) that is mechanically coupled to the fan impeller (106) such that rotating the fan impeller (106) causes the pump impeller (112) to rotate such that liquid is circulated in the closed loop liquid cooling system (100). In the example depicted in FIG. 2, however, the component parts of the closed loop liquid cooling system (100) are depicted as being connected so that the closed loop liquid cooling system (100) can be depicted in its assembled form. As such, some portions of the closed loop liquid cooling system (100), such as the pump impeller (112 of FIG. 1), are hidden from view. Readers will appreciate that while some portions of the closed loop liquid cooling system (100) are hidden from view, the closed loop liquid cooling system (100) of FIG. 2 includes all of the parts illustrated in FIG. 1.

The example depicted in FIG. 2 includes dashed arrows representing the flow of liquid through the closed loop liquid cooling system (100) depicted in FIG. 2. The closed loop liquid cooling system (100) depicted in FIG. 2 may operate by the electric motor (110) receiving electrical power from a power source, thereby causing the electric motor (110) to deliver mechanical power to the fan impeller (106) such that the fan impeller (106) rotates. The rotation of the fan impeller (106) causes the pump impeller (112 of FIG. 1) to rotate, thereby causing liquid to flow through the closed loop liquid delivery system (104) in the direction illustrated by the dashed arrows.

In the example depicted in FIG. 2, liquid flows away from the pump impeller (112 of FIG. 1) through the closed loop liquid delivery system (104) and into the cold plate (102). Liquid flows through the cold plate (102)—receiving thermal energy from the electronic package underneath the cold plate (102)—and flows out of the cold plate (102) via the closed loop liquid delivery system (104) and towards the radiator (108). Liquid flows into the radiator (108)—which removes thermal energy from the liquid—and flows out of the radiator (108) back towards the pump impeller (112 of FIG. 1). In the example of FIG. 2, liquid may flow into the radiator (108) via a liquid inlet for receiving liquid from the closed loop liquid delivery system (104) and liquid may flow out of the radiator (108) via a liquid outlet for expelling liquid into the closed loop liquid delivery system (104). In such a way, liquid is circulated through the closed loop liquid cooling system (100), absorbing thermal energy at the cold plate (102) and releasing thermal energy at the radiator (108) with each lap of circulation. All the while, the fan impeller (106) rotates and causes air to flow through the radiator (108) in order to remove thermal energy from the radiator (108) as hot air exhaust that flows out of a chassis that includes the closed loop liquid cooling system (100).

Figure 3:
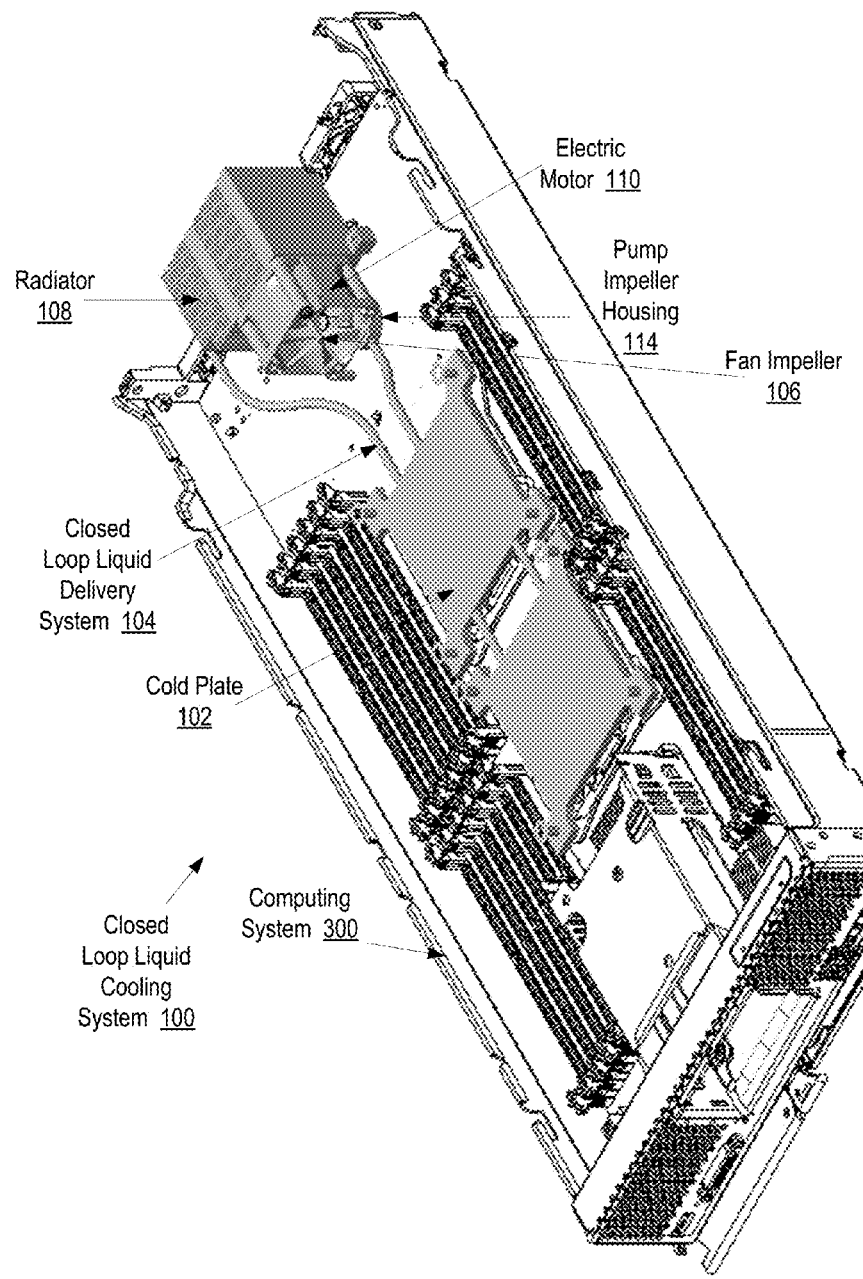
FIG. 3 sets forth a diagram of a computing system that includes a closed loop liquid cooling system for electronic packages according to embodiments of the present invention.

For further explanation, FIG. 3 sets forth a diagram of a computing system (300) that includes a closed loop liquid cooling system for electronic packages according to embodiments of the present invention. The computing system (300) of FIG. 3 can include a computer processor, which is not shown as the processor can reside underneath the cooling plate (102). The computing system (300) of FIG. 3 can also include computer memory (not shown), such as a hard disk, random access memory ('RAM') and so on. In the example method of FIG. 3, for example, the computer memory may reside within the dual in-line memory ('DIMM') slots of the computing system (300).

In the example depicted in FIG. 3, the closed loop liquid cooling system (100) represents physical mechanisms for cooling electronic packages such as a computer processor. Although not depicted in FIG. 3, a computer processor may sit underneath the cold plate (102) depicted in FIG. 3 such that the closed loop liquid cooling system (100) removes heat from the computer processor.

The closed loop liquid cooling system (100) depicted in FIG. 3 includes a fan impeller (106) configured so that air flows from the fan impeller through the radiator of the closed loop liquid cooling system. In the example method of FIG. 3, fan impeller (106) is configured so that air flows from the fan impeller through the radiator of the closed loop liquid cooling system when the fan impeller (106) is rotated, such that cooler air is drawn into a chassis that includes the closed loop liquid cooling system (100) and warm air heated by the operation of the electronic package is expelled from a chassis that includes the closed loop liquid cooling system (100). In such a way, the fan impeller (106) may be part of an active cooling component for removing heat generated by the operation of the electronic package and other heat-producing computing devices.

The closed loop liquid cooling system (100) depicted in FIG. 3 also includes an electric motor (110) coupled to the fan impeller (106). The electric motor (110) of FIG. 3 may be embodied, for example, as an electric machine that converts electrical energy into mechanical energy. Such an electric motor (110) may receive electrical energy from a power source such as a battery, a PDU, and so on. The electric motor (110) of FIG. 3 may be coupled to the fan impeller (106), for example, by an impeller shaft as will be described below in greater detail. In such an example, the electric motor (110) may impart mechanical energy onto the impeller shaft, thereby causing the fan impeller (106) to rotate.

The closed loop liquid cooling system (100) depicted in FIG. 3 also includes a pump impeller (112 of FIG. 1). The pump impeller (112 of FIG. 1) may be embodied, for example, as a rotor used to alter the pressure and flow of a liquid. For example, the pump impeller (112 of FIG. 1) may be positioned relative to the closed loop liquid delivery system (104) such that rotating the pump impeller (112 of FIG. 1) causes liquid to flow through the closed loop liquid delivery system (104). Liquid may flow through the closed loop liquid delivery system (104), for example, by the rotation of the pump impeller (112 of FIG. 1) causing fins of the pump impeller (112 of FIG. 1) to push the liquid through the pipes that comprise the closed loop liquid delivery system (104). In such a way, liquid flows through the cold plate and removes heat from the electronic package. As such, the pump impeller (112 of FIG. 1) is configured for delivering liquid to the electronic package via a cold plate (102).

The pump impeller (112 of FIG. 1) is mechanically coupled to the fan impeller (106) such that rotating the fan impeller (106) causes the pump impeller (112 of FIG. 1) to rotate such that liquid is circulated in the closed loop liquid cooling system (100). The pump impeller (112 of FIG. 1) may be mechanically coupled to the fan impeller (106) of FIG. 3, for example, through the use of a bevel gear as will be described in greater detail below. In such an example, teeth of the bevel gear that are located on a shaft for the fan impeller (106) may be mechanically coupled to teeth of the bevel gear that are located on a shaft for the pump impeller (112 of FIG. 1), such that rotating the fan impeller (106) causes the pump impeller (112 of FIG. 1) to rotate. In such an example, the rotation of the pump impeller (112 of FIG. 1) may cause liquid to flow through the closed loop liquid delivery system (104).

In the example of FIG. 3, the closed loop liquid delivery system (104) may be embodied as a pipe through which liquid can flow. The closed loop liquid delivery system (104) may be coupled through a cold plate (102) that transfers heat generated by computing components such as the electronic package. Such a cold plate (102) may transfer heat away from heat-generating computing components through physical contact with the heat-generating computing components or their mountings. In such an example, liquid can flow through the closed loop liquid delivery system (104) into the cold plate (102), at which point heat generated by the heat-generating computing component will be transferred to the liquid flowing through the cold plate (102). The heated liquid may subsequently exit the cold plate (102) via the closed loop liquid delivery system (104) for delivery to a radiator (108).

The radiator (108) of FIG. 3 may be embodied, for example, as heat exchanger used to transfer thermal energy from one medium to another for the purpose of cooling liquid that flows through the closed loop liquid delivery system (104). In the example of FIG. 3, liquid may be heated as it flows through the cold plate (102) and exits the cold plate (102) via the closed loop liquid delivery system (104). Upon delivery of the heated liquid from the closed loop liquid delivery system (104) to the radiator (108), the radiator may remove heat from the liquid through thermal convection, transferring the thermal energy from the liquid to the ribs of the radiator (108). In such an example, the airflow generated by the rotation of the fan impeller (106) may cause air to flow through the radiator (108), transferring thermal energy from the radiator (108) away from the electronic package, such that thermal energy is removed from a chassis that includes the closed loop liquid cooling system (100) as exhaust from the chassis.

In the example of FIG. 3, the computing system (300) is depicted as being a blade server, but readers will appreciate that the depiction of the computing system (300) as a blade server is only for explanation and does not represent a limitation as to the form taken by the computing system (300). Computing systems according to embodiments of the present invention may take many forms such as a traditional server, a personal computer, and so on.

Figure 4:
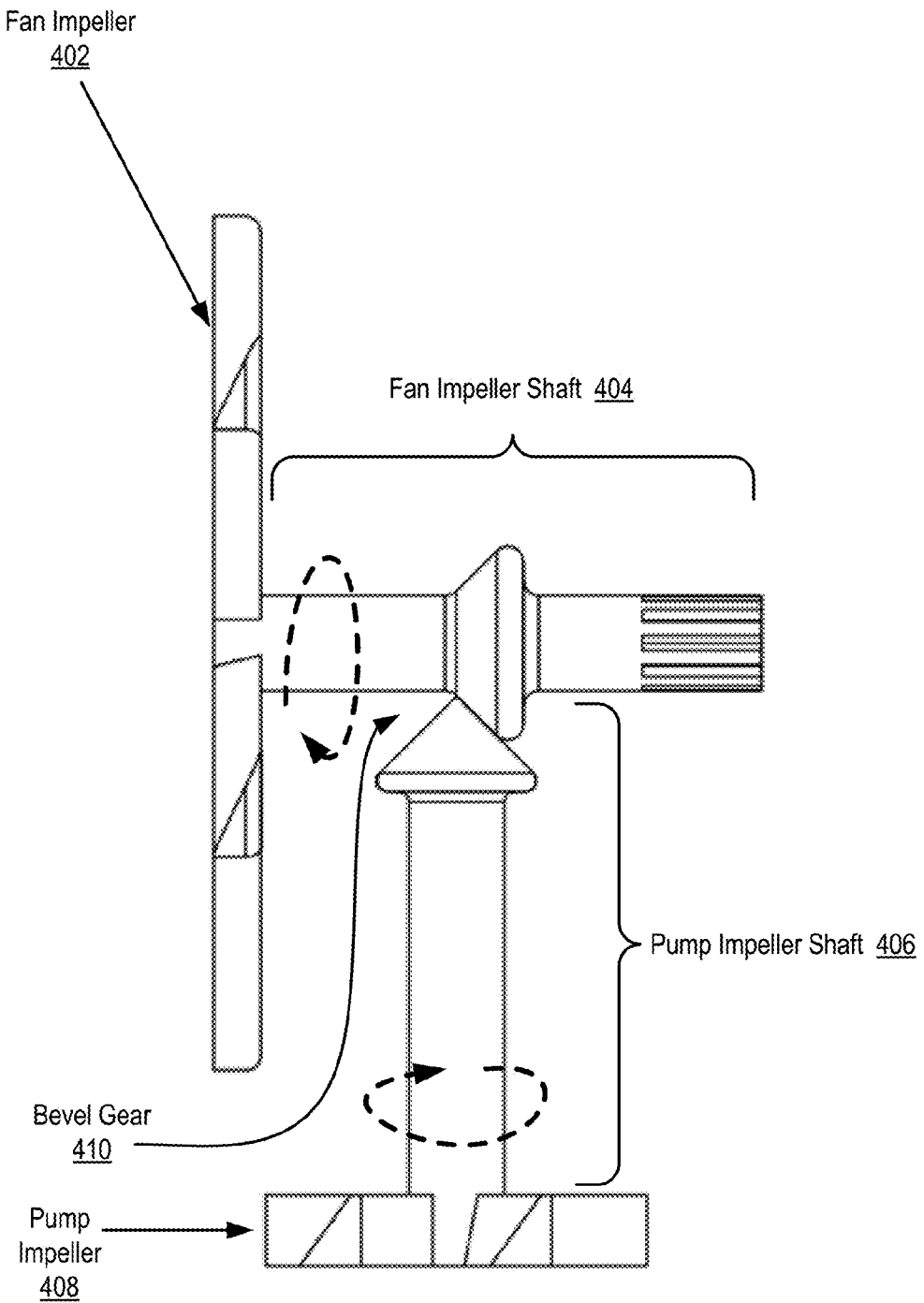
FIG. 4 sets forth a more detailed view of a mechanical coupling between a fan impeller and a pump impeller according to embodiments of the present invention.

For further explanation, FIG. 4 sets forth a more detailed view of a mechanical coupling between a fan impeller (402) and a pump impeller (408) according to embodiments of the present invention. In the example depicted in FIG. 4, the fan impeller (402) is coupled to a fan impeller shaft (404). The fan impeller shaft (404) may be coupled to an electronic motor on the end of the fan impeller shaft (404) that opposes the fan impeller (402). In such a way, the electronic motor may deliver mechanical energy to the fan impeller shaft (404), thereby causing the fan impeller shaft (404) to rotate in the direction indicated by the dashed line. In such an example, rotating the fan impeller shaft (404) causes the fan impeller (402) to also rotate as the fan impeller (402) is fixed to the fan impeller shaft (404).

In the example depicted in FIG. 4, the pump impeller (408) is coupled to a pump impeller shaft (406). The pump impeller (408) is fixed to the pump impeller shaft (406), such that rotating the pump impeller shaft (408) as indicated by the dashed line also causes the pump impeller (408) to rotate. In the example depicted in FIG. 4, the pump impeller shaft (408) may be rotated through the use of a bevel gear (410), where one gear is fixed to the fan impeller shaft (404), another gear is fixed to the pump impeller shaft (406). In such an example, the mechanical coupling of the gear that is fixed to the pump impeller shaft (406) and the gear that is fixed to the fan impeller shaft (404), causes the pump impeller shaft (406) to rotate when the fan impeller shaft (404) is rotated.

The bevel gear (410) of FIG. 4 may be embodied as a gear designed such that the axes of the two shafts (404, 406) intersect and that tooth-bearing faces (not shown) of the gears themselves are conically shaped. Bevel gears are typically mounted on shafts that intersect at a 90 degree angle, but bevel gears can be designed to work at other angles as well. As the fan impeller shaft (404) is rotated, for example, by a motor, teeth on the gear that is fixed to the fan impeller shaft (404) apply a force to teeth on the gear that is fixed to the pump impeller shaft (406), such that the pump impeller shaft (406) is rotated, thereby causing the pump impeller (408) to rotate.

Readers will appreciate that the mechanical coupling between the fan impeller (402) and pump impeller (408) allows two cooling mechanisms to be driven by a single power source. That is, the fan impeller (402) is driven by a single power source such that air cooling is made possible and the pump impeller (408) is also driven, indirectly through a mechanical coupling, by the same power source such that liquid cooling is made possible. In such a way, the mechanical coupling described above enables air cooling mechanisms and liquid cooling mechanisms to be utilized in a power efficient way as the air cooling mechanisms and the liquid cooling mechanisms only required a single power source to operate.

Figure 5:
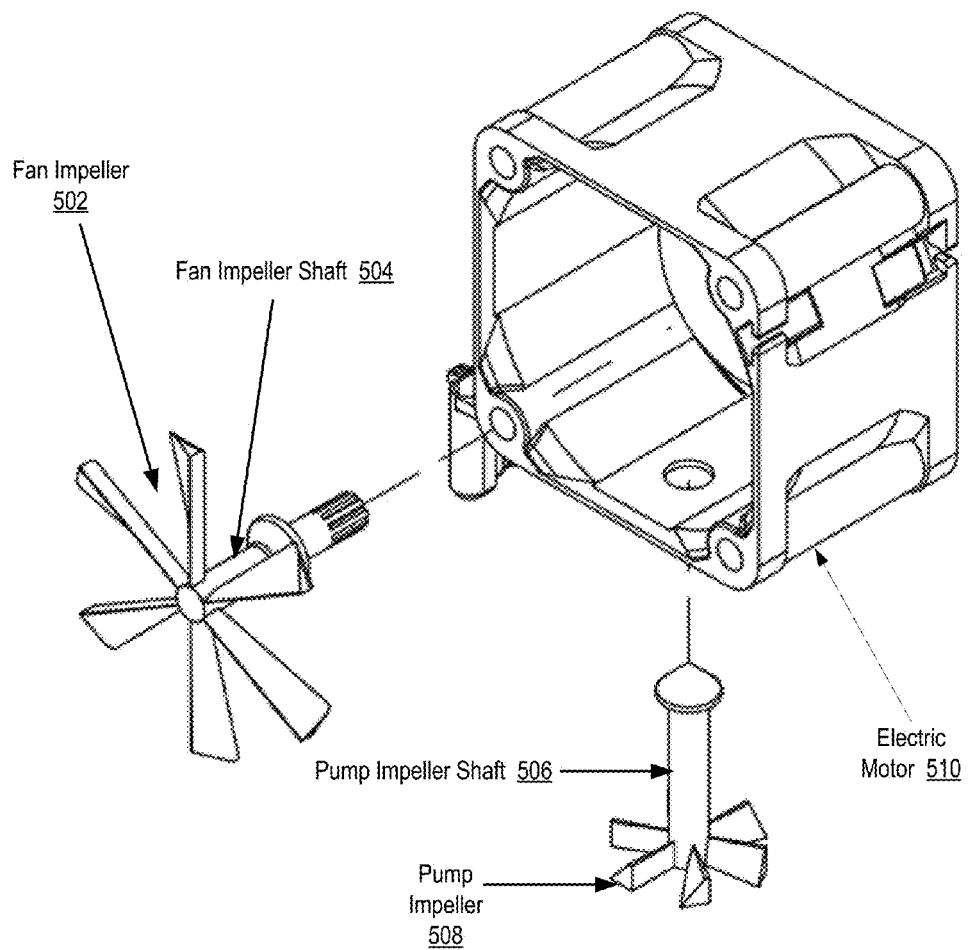
FIG. 5 sets forth a detailed view of a portion of a closed loop liquid cooling system for electronic packages according to embodiments of the present invention.

For further explanation, FIG. 5 sets forth a detailed view of a portion of a closed loop liquid cooling system for electronic packages according to embodiments of the present invention. The example depicted in FIG. 5 includes a fan impeller (502)

fixed to a fan impeller shaft (504) and a pump impeller (508) fixed to a pump impeller shaft (508). The example depicted in FIG. 5 also includes an electric motor (510) and surround housing into which the fan impeller (502) fixed to the fan impeller shaft (504) and the pump impeller (508) fixed to the pump impeller shaft (506) are inserted. The example depicted in FIG. 5 illustrates the components as being unconnected so as to show additional detail.

Readers will appreciate that although embodiments are described in which rotating a fan impeller causes a pump impeller to be rotated, other embodiments within the scope of the present application may be configured such that a motor applies mechanical energy to the pump impeller. In such embodiments, the pump impeller and the fan impeller may still be mechanically coupled such that rotating the pump impeller causes the fan impeller to rotate.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A closed loop liquid cooling system including:
   a fan impeller coupled to a fan impeller shaft and oriented so that air flows from the fan impeller through a radiator of the closed loop liquid cooling system;
   an electric motor coupled to the fan impeller, wherein the electric motor rotates the fan impeller; and
   a pump impeller coupled to a pump impeller shaft, wherein the pump impeller delivers liquid to an electronic package via a cold plate, the pump impeller shaft mechanically coupled to the fan impeller shaft such that rotating the fan impeller shaft causes the pump impeller to rotate such that liquid is circulated in the closed loop liquid cooling system by the pump impeller;
   wherein the pump impeller shaft and the fan impeller shaft are oriented perpendicular to each other.

2. The closed loop liquid cooling system of claim 1 wherein the radiator is coupled to the closed loop liquid cooling system, the radiator including a liquid inlet for receiving liquid from the closed loop liquid cooling system and a liquid outlet for expelling liquid into the closed loop liquid cooling system.

3. The closed loop liquid cooling system of claim 2 wherein the radiator is located relative to the fan impeller such that air flows from the fan impeller through the radiator and away from a plurality of electronic packages.

4. The closed loop liquid cooling system of claim 2 wherein the closed loop liquid cooling system includes a pump impeller housing for receiving the pump impeller.

5. The closed loop liquid cooling system of claim 1 wherein the mechanical coupling of the fan impeller shaft and the pump impeller shaft includes:
   a first bevel gear included in the fan impeller shaft; and
   a second bevel gear included in the pump impeller shaft;
   wherein the first and second bevel gears are oriented such that rotating the fan impeller shaft causes the pump impeller to rotate such that liquid is circulated in the closed loop liquid cooling system.

6. The closed loop liquid cooling system of claim 1 wherein a computer processor is cooled by the closed loop liquid cooling system.

7. A computing system that includes a closed loop liquid cooling system a computer processor, and computer memory, the closed loop liquid cooling system comprising:
   a fan impeller coupled to a fan impeller shaft and oriented so that air flows from the fan impeller through a radiator of the closed loop liquid cooling system;
   an electric motor coupled to the fan impeller, wherein the electric motor rotates the fan impeller; and
   a pump impeller coupled to a pump impeller shaft, wherein the pump impeller delivers liquid to an electronic package via a cold plate, the pump impeller shaft mechanically coupled to the fan impeller shaft such that rotating the fan impeller shaft causes the pump impeller to rotate such that liquid is circulated in the closed loop liquid cooling system by the pump impeller;
   wherein the pump impeller shaft and the fan impeller shaft are oriented perpendicular to each other.

8. The computing system of claim 7 wherein the closed loop liquid cooling system wherein the radiator is coupled to the closed loop liquid cooling system, the radiator including a liquid inlet for receiving liquid from the closed loop liquid cooling system and a liquid outlet for expelling liquid into the closed loop liquid cooling system.

9. The computing system of claim 8 wherein the radiator is located relative to the fan impeller such that air flows from the fan impeller through the radiator and away from the electronic packages.

10. The computing system of claim 8 wherein the closed loop liquid cooling system includes a pump impeller housing for receiving the pump impeller.

11. The computing system of claim 7 wherein the mechanical coupling of the fan impeller shaft and the pump impeller shaft includes:
    a first bevel gear included in the fan impeller shaft; and
    a second bevel gear included in the pump impeller shaft;
    wherein the first and second bevel gears are oriented such that rotating the fan impeller shaft causes the pump impeller to rotate such that liquid is circulated in the closed loop liquid cooling system.

12. The computing system of claim 7 wherein the computer processor is cooled by the closed loop liquid cooling system.

13. The closed loop liquid cooling system of claim 1, further comprising:
    a fan impeller housing including the fan impeller;
    an electronic package; and
    a radiator coupled to the closed loop liquid cooling system, the radiator including a liquid inlet for receiving liquid from the closed loop liquid cooling system and a liquid outlet for expelling liquid into the closed loop liquid cooling system;
    wherein the electronic package and the radiator are placed on opposite sides of the fan impeller housing.

14. The closed loop liquid cooling system of claim 13, wherein the fan impeller is oriented such that when the electric motor rotates the fan impeller, air flows away from the electronic package, through the fan impeller housing, through the radiator, and out a chassis that includes the closed loop liquid cooling system.

15. The closed loop liquid cooling system of claim 1, further comprising an electric motor housing that includes the electric motor, the fan impeller, the fan impeller shaft, and the pump impeller shaft.

16. The closed loop liquid cooling system of claim 15, wherein the electric motor housing is mechanically coupled to the pump impeller housing and a radiator.

17. The closed loop liquid cooling system of claim 6, wherein the computer processor is located under the cold plate.

18. The computing system of claim 7, further comprising:
a fan impeller housing including the fan impeller;
an electronic package; and
a radiator coupled to the closed loop liquid cooling system, the radiator including a liquid inlet for receiving liquid from the closed loop liquid cooling system and a liquid outlet for expelling liquid into the closed loop liquid cooling system;
wherein the electronic package and the radiator are placed on opposite sides of the fan impeller housing.

19. The computing system of claim 18, wherein the fan impeller is oriented such that when the electric motor rotates the fan impeller, air flows away from the electronic package, through the fan impeller housing, through the radiator, and out a chassis that includes the closed loop liquid cooling system.

20. The computing system of claim 12, wherein the computer processor is located under the cold plate.

* * * * *